(12) United States Patent
Furuichi et al.

(10) Patent No.: US 9,386,695 B2
(45) Date of Patent: Jul. 5, 2016

(54) WIRING SUBSTRATE HAVING MULTIPLE CORE SUBSTRATES

(71) Applicant: SHINKO ELECTRIC INDUSTRIES CO., LTD., Nagano-shi, Nagano (JP)

(72) Inventors: Jun Furuichi, Nagano (JP); Akihiko Tateiwa, Nagano (JP); Naoyuki Koizumi, Nagano (JP)

(73) Assignee: SHINKO ELECTRIC INDUSTRIES CO., LTD., Nagano-shi, Nagano (JP)

( * ) Notice: Subject to any disclaimer, the term of this patent is extended or adjusted under 35 U.S.C. 154(b) by 212 days.

(21) Appl. No.: 13/855,762

(22) Filed: Apr. 3, 2013

(65) Prior Publication Data

US 2013/0264101 A1    Oct. 10, 2013

(30) Foreign Application Priority Data

Apr. 9, 2012 (JP) .................. 2012-088642

(51) Int. Cl.
| | |
|---|---|
| H05K 1/09 | (2006.01) |
| H05K 1/11 | (2006.01) |
| H05K 1/02 | (2006.01) |
| H05K 3/46 | (2006.01) |
| H05K 3/00 | (2006.01) |
| H01L 23/14 | (2006.01) |
| H01L 23/15 | (2006.01) |
| H01L 23/498 | (2006.01) |

(52) U.S. Cl.
CPC .............. *H05K 1/115* (2013.01); *H05K 1/0298* (2013.01); *H05K 3/4605* (2013.01); *H01L 23/145* (2013.01); *H01L 23/15* (2013.01); *H01L 23/49822* (2013.01); *H01L 23/49827* (2013.01); *H01L 23/49833* (2013.01); *H01L 2224/16* (2013.01); *H05K 3/002* (2013.01); *H05K 3/4694* (2013.01); *H05K 2201/09227* (2013.01)

(58) Field of Classification Search
USPC ......... 174/251, 250, 253, 255, 257, 258, 261, 174/262, 264
See application file for complete search history.

(56) References Cited

U.S. PATENT DOCUMENTS

| | | | |
|---|---|---|---|
| 2012/0048604 A1* | 3/2012 | Cornejo et al. | 174/258 |
| 2012/0129988 A1* | 5/2012 | Fujimaru et al. | 524/114 |

FOREIGN PATENT DOCUMENTS

JP   2003-204152 A   7/2003

* cited by examiner

*Primary Examiner* — Tremesha S Willis
(74) *Attorney, Agent, or Firm* — Drinker Biddle & Reath LLP (57) ABSTRACT

There is provided a wiring substrate including: a core substrate including: a first core substrate including: a plate-shaped first glass substrate; and a first through electrode formed through the first glass substrate; a second core substrate including: a plate-shaped second glass substrate; and a second through electrode formed through the second glass substrate, wherein a diameter of the second through electrode is different from that of the first through electrode; and an insulating member encapsulating the first and second core substrates, and a wiring layer formed on at least one surface of the core substrate. The first and second core substrates are arranged to be separated from each other when viewed from a top.

6 Claims, 10 Drawing Sheets

WIRING SUBSTRATE HAVING MULTIPLE CORE SUBSTRATES

This application claims priority from Japanese Patent Application No. 2012-088642, filed on Apr. 9, 2012, the entire contents of which are herein incorporated by reference.

BACKGROUND

1. Technical Field

Embodiments described herein relate to a wiring substrate and a method of manufacturing a wiring substrate.

2. Description of the Related Art

In the related art, a substrate on which electronic components are mounted is a so-called multi-layer wiring substrate in which a plurality of insulating layers and wiring layers are formed on both surfaces of a core substrate. The material of the core substrate is glass epoxy, for example. In such a wiring substrate, the difference in the thermal expansion coefficient between the wiring pattern (for example, copper) of the wiring layer and the core substrate causes warpage due to thermal expansion in the wiring substrate. The use of a material with a low thermal expansion coefficient, for example, glass, for the core substrate is one effective method to reduce the warpage of the wiring substrate (for example, see JP-A-2003-204152).

Meanwhile, according to an increase in the number of integrated elements and signal processing in electronic components (for example, semiconductor chips) in recent years, the density of wiring lines formed on the substrate partially increases with an increase in the number of electrode pads formed in the semiconductor chip (an increase in the number of pins). For this reason, it is not possible to form wiring lines on the wiring substrate having a predetermined number of layers.

On the other hand, a configuration may be considered in which the diameter of a through electrode connected to a semiconductor chip, among through electrodes formed in a core substrate, is partially reduced. However, when glass is used as the core substrate, it is difficult to form through electrodes having different diameters in the same core substrate.

SUMMARY OF THE INVENTION

According to one or more aspects of the present invention, there is provided a wiring substrate including: a core substrate including: a first core substrate including: a plate-shaped first glass substrate; and a first through electrode formed through the first glass substrate, and a second core substrate including: a plate-shaped second glass substrate; and a second through electrode formed through the second glass substrate, wherein a diameter of the second through electrode is different from that of the first through electrode, and an insulating member encapsulating the first and second core substrates; and a wiring layer formed on at least one surface of the core substrate. The first and second core substrates are arranged to be separated from each other when viewed from a top.

According to an aspect of the present invention, it is possible to provide a wiring substrate, which includes a core substrate in which through electrodes having different diameters are formed, and a method of manufacturing a wiring substrate.

DETAILED DESCRIPTION OF EXEMPLARY EMBODIMENTS

Hereinafter, exemplary embodiments of the present invention will be described with reference to the accompanying drawings. In all the drawings for the explanation of the embodiments, the members having the same functions are represented by the same reference numerals, and repeated description thereof will be omitted. In addition, the accompanying drawings are intended to describe the outline of the structure, and do not indicate the actual size or ratio.

Figure 1:
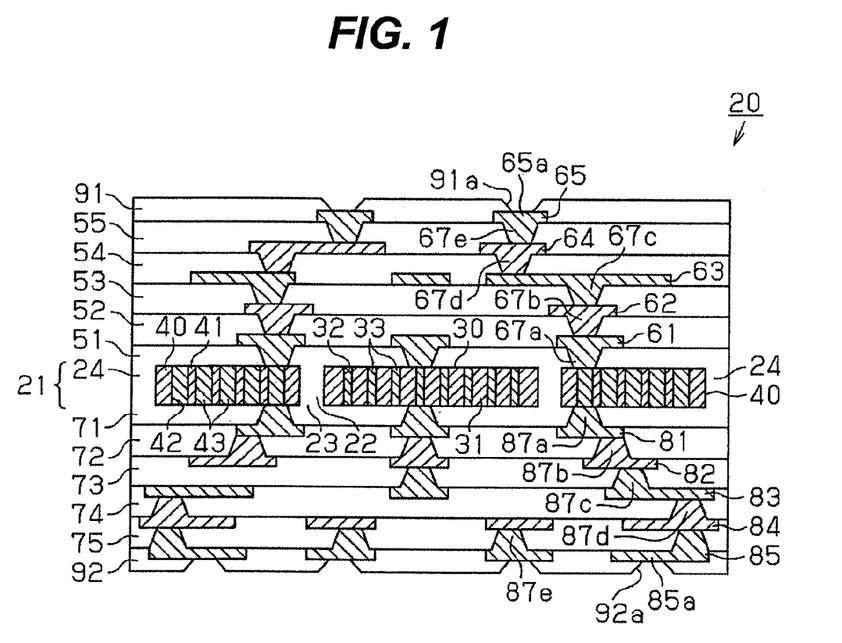
FIG. 1 is a schematic cross-sectional view of a wiring substrate.

As shown in FIG. 1, a wiring substrate 20 has a core substrate 21 in the middle in the thickness direction (vertical direction in the drawing).

Figure 2:
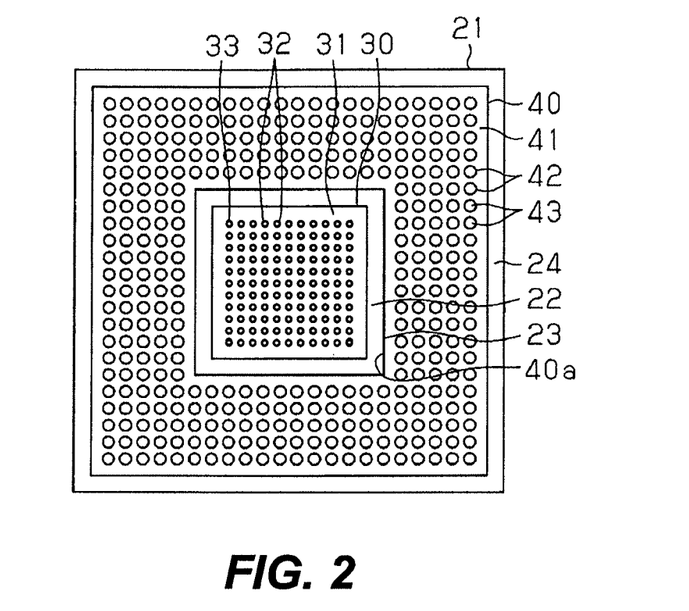
FIG. 2 is a schematic diagram of a core substrate.

As shown in FIGS. 1 and 2, the core substrate 21 has first and second core substrates 30 and 40 and first and second insulating members 23 and 24. The first core substrate 30 is formed in a rectangular shape in plan view. The second core substrate 40 is formed in a rectangular frame shape in plan view. The first core substrate 30 is housed in a rectangular housing hole 40a formed in the middle of the second core substrate 40. The sizes of the first core substrate 30 and the housing hole 40a are set so as to form a gap 22 between the outer surface of the first core substrate 30 and the inner peripheral surface of the housing hole 40a.

As shown in FIG. 1, the first core substrate 30 has a plate-shaped first glass substrate 31. A plurality of first through holes 32 passing through (passing through in the thickness direction) a first surface (upper surface in FIG. 1) and a second surface (lower surface in FIG. 1, and a surface opposite the first surface) are formed in the first glass substrate 31. As shown in FIG. 2, the first through holes 32 are formed in a matrix manner at predetermined pitches (first pitches) therebetween. Herein, the wording "pitch" is defined as a distance between center positions of adjacent through holes. The hole diameter (first diameter) of the first through hole 32 is 180 μm (micrometers), for example. The pitch between the first through holes 32 is 375 μm, for example. As shown in FIG. 1, a first through electrode 33 passing through the first surface (upper surface) and the second surface (lower surface) of the first glass substrate 31 is formed in the first through hole 32. The first through electrode 33 is copper (Cu), for example.

The second core substrate 40 has a plate-shaped second glass substrate 41. The second glass substrate 41 is formed in the same thickness as the first glass substrate 31. The first and second glass substrates 31 and 41 are arranged to be separated from each other in a planar direction. In the second glass substrate 41, a plurality of second through holes 42 passing through the upper and lower surfaces thereof are formed as in the first glass substrate 31. As shown in FIG. 2, the second through holes 42 are formed in a matrix manner at predetermined pitches (second pitches) therebetween. The second through hole 42 is formed in a larger hole diameter (second diameter) than the first through hole 32. In addition, the second through holes 42 are formed at larger pitches than the pitch between the first through holes 32. The hole diameter of the second through hole 42 is 250 µm, for example. The pitch between the second through holes 42 is 475.2 µm, for example. As shown in FIG. 1, a second through electrode 43 passing through the upper and lower surfaces of the second glass substrate 41 is formed in the second through hole 42. The second through electrode 43 is copper (Cu), for example.

As shown in FIG. 1, the gap 22 between the first and second core substrates 30 and 40 is filled with a first insulating member 23. In addition, an outer peripheral edge of the second core substrate 40 (second glass substrate 41) is covered by a second insulating member 24.

As shown in FIG. 1, a plurality of (in the present embodiment, five) insulating layers 51 to 55 and five wiring layers 61 to 65 are alternately formed above the core substrate 21. In addition, insulating layers 71 to 75 and wiring layers 81 to 85 are alternately formed below the core substrate 21. The material of the insulating layers 51 to 55 and 71 to 75 is an epoxy-based insulating resin, for example. The material of the wiring layers 61 to 65 and 81 to 85 is copper, for example. The wiring layer 61 is electrically connected to the first and second through electrodes 33 and 43 through a via 67a. In addition, the wiring layer 81 is electrically connected to the first and second through electrodes 33 and 43 through a via 87a. The wiring layers 61 to 65 and 81 to 85 are connected to each other through vias 67b to 67e and 87b to 87e. The surfaces of the insulating layer 55 and the wiring layer 65 are covered by a protective layer 91, such as solder resist. An opening 91a is formed at a predetermined position of the protective layer 91, and the wiring layer 65 is exposed as an electrode 65a, which is connected to an electrode pad of an electronic component such as a semiconductor chip (not shown), through the opening 91a. In addition, the surfaces of the insulating layer 75 and the wiring layer 85 are covered by a protective layer 92. An opening 92a is formed at a predetermined position of the protective layer 92, and the wiring layer 85 is also exposed as an electrode 85a through the opening 92a.

The core substrate 21 of the wiring substrate 20 of the present embodiment has the first and second core substrates 30 and 40 and the first and second insulating members 23 and 24. In the first glass substrate 31 of the first core substrate 30, the first through electrode 33 is formed in the first through hole 32 formed in a predetermined hole diameter (first diameter). In addition, in the second glass substrate 41 of the second core substrate 40, the second through electrode 43 is formed in the second through hole 42 formed in a larger hole diameter (second diameter) than the first through hole 32. The first and second core substrates 30 and 40 are arranged to be separated from each other in a planar direction with the first insulating member 23 interposed therebetween. The wiring layer 61 located above the core substrate 21 is electrically connected to the first and second through electrodes 33 and 43 through the via 67a. The wiring layers 61 to 65 are connected to each other through the vias 67b to 67e. In addition, the wiring layer 65 is exposed as the electrode 65a, which is connected to an electronic component such as a semiconductor chip, through the opening 91a of the protective layer 91 that covers the insulating layer 55 and the wiring layer 65. In addition, the insulating layers 71 to 75 and the wiring layers 81 to 85 located below the core substrate 21 are configured in the same manner as the insulating layers 51 to 55 and the wiring layers 61 to 65.

In such a configuration, a narrow-pitch (multi-pin) device such as a semiconductor chip can be connected to the electrode 65a, for example, by forming the first through electrodes 33 having small diameters at narrow pitches therebetween in order to increase the wiring density of the wiring layers 61 to 65 connected to the first through electrodes 33. In addition, the wiring layers 61 to 65 connected to the second through electrodes 43 having large diameters can be formed with a desired wiring density according to other electronic components (having relatively large pitches) and the like. That is, the wiring substrate 20 that can be more reliably connected to mounting components can be configured by forming the first and second through electrodes 33 and 43, which have different diameters according to mounting components, in the core substrate 21.

The process of forming a through hole in the glass substrate will be described with reference to FIGS. 3A-3E.

Figure 3A:
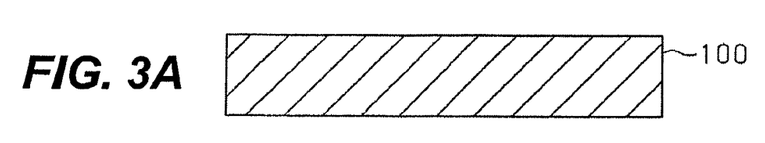
FIGS. 3A-3E are schematic cross-sectional views showing the process of forming through holes in a glass substrate.

The plate-shaped glass plate 100 shown in FIG. 3A is prepared. The material of the glass plate 100 is photosensitive glass, for example. This photosensitive component is gold (Au), silver (Ag), copper oxide ($Cu_2O$), and cerium oxide ($CeO_2$), for example.

Figure 3B:
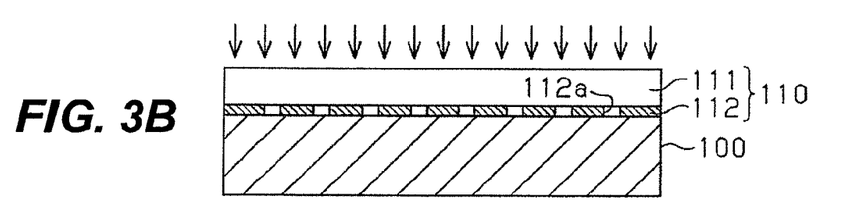

As shown in FIG. 3B, the glass plate 100 is exposed using a photomask (reticle) 110. The photomask 110 has a substrate 111 and a mask pattern 112 formed on the substrate 111. An opening 112a according to the through hole formed in the glass plate 100 is formed in the mask pattern 112. The substrate 111 is quartz glass, for example. The mask pattern 112 is a metal film formed of chromium, for example. In the exposure process, the glass plate 100 is exposed through the opening 112a of the mask pattern 112, thereby forming an exposed portion 101 shown in FIG. 3C in the glass plate 100.

Figure 3C:
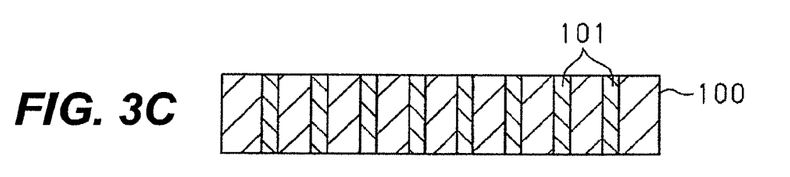

Then, heat treatment is performed on the glass plate 100 in which the exposed portion 101 is formed. This heat treatment is pretreatment for etching the exposed portion 101 easily. The heat treatment is performed at a temperature between the transition point and the yield point of a material used for the glass plate 100, for example.

Figure 3D:
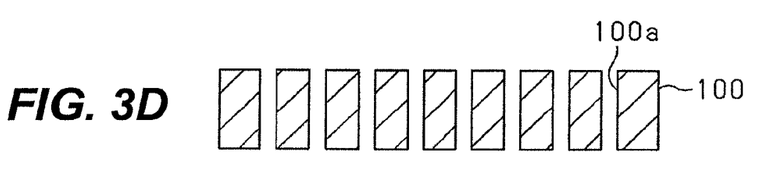

Then, the exposed portion 101 is etched from the heat-treated glass plate 100. In this etching process, for example, the glass plate 100 is immersed in diluted hydrofluoric acid to etch the exposed portion 101. As shown in FIG. 3D, in the glass plate 100 after the etching process, a plurality of through holes 100a passing through the upper and lower surfaces thereof (passing through the glass plate 100 in its thickness direction) are formed.

Figure 3E:
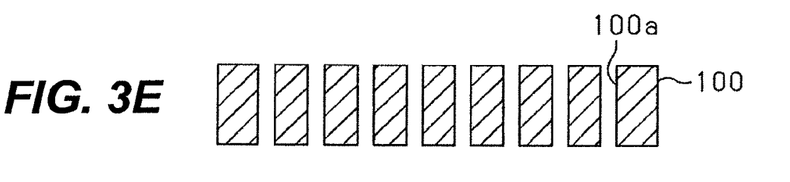

Then, a crystallization process is performed on the glass plate 100 in which the through holes 100a are formed. In this crystallization process, heat treatment is performed after the glass plate 100 is irradiated with ultraviolet rays, for example. This crystallization process is a process for improving the characteristics of the glass plate 100, and improves the characteristics, such as the mechanical strength, a thermal expansion coefficient, or a transmittance of the glass plate 100, to desired values. For example, by setting the thermal expansion coefficient of the glass plate 100 close to the thermal expansion coefficient of the material (for example, copper) of the wiring layers 61 to 65 and 81 to 85, warpage due to thermal expansion of the wiring substrate 20 is reduced. Accordingly, it is possible to prevent disconnection or the like of the wiring layers 61 to 65 and 81 to 85 (wiring patterns). The glass plate 100 having a plurality of through holes 100a is formed by such crystallization process, as shown in FIG. 3E.

Figure 4A:
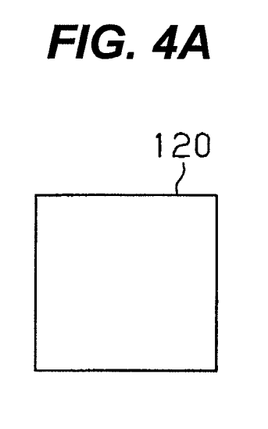
FIGS. 4A and 4B are plan views showing the process of manufacturing a first core substrate.
Figure 4B:
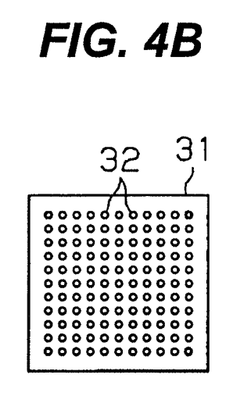
Figure 5A:
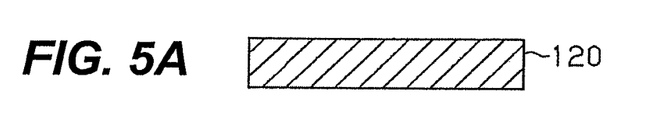
FIGS. 5A-5C are schematic cross-sectional views showing the process of manufacturing the first core substrate.
Figure 5B:
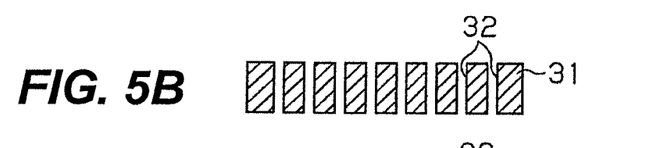
Figure 5C:
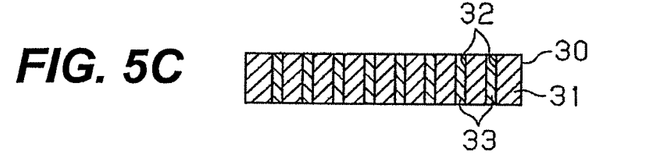

Next, the process of manufacturing the first core substrate 30 will be now described. As shown in FIGS. 4A and 5A, a glass plate 120 having an appropriately rectangular shape in plan view is prepared. First, a through hole is formed in the glass plate 120 using the above-described photolithography method, and a crystallization process is performed to form the first glass substrate 31 shown in FIGS. 4B and 5B. Then, as shown in FIG. 5C, the first through electrode 33 is formed in the first through hole 32. In order to form the first through electrode 33, copper is deposited in the first through hole 32 using an electrolytic plating method, for example, and a portion protruding from first and second surfaces (upper and lower surfaces) of the first glass substrate 31 of the deposited copper is polished. The surface of the first through electrode 33 is made to be flush with the first and second surfaces of the first glass substrate 31.

Figure 6A:
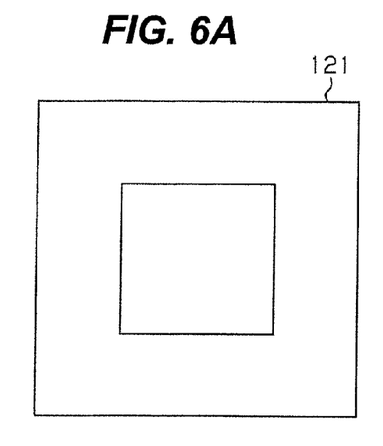
FIGS. 6A and 6B are plan views showing the process of manufacturing a second core substrate.
Figure 6B:
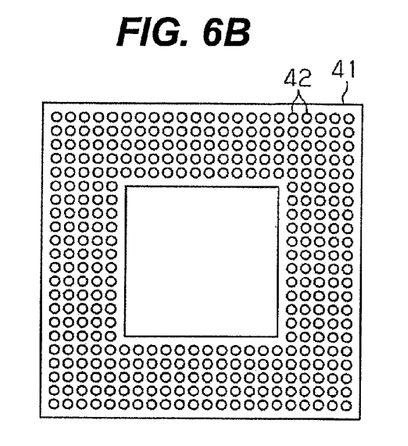
Figure 7A:
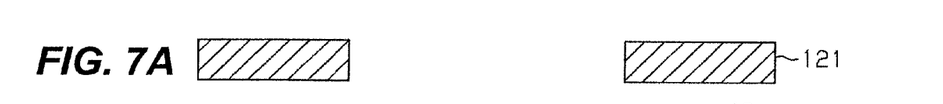
FIGS. 7A-7C are schematic cross-sectional views showing the process of manufacturing the second core substrate.
Figure 7B:
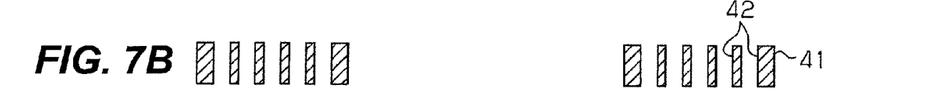
Figure 7C:
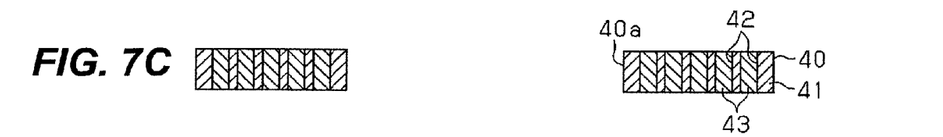

Next, the process of manufacturing the second core substrate 40 will be now described. As shown in FIGS. 6A and 7A, a glass plate 121 formed in an annular rectangular shape is prepared. First, a through hole is formed in the glass plate 121 using a photolithography method, and a crystallization process is performed to form the second glass substrate 41 shown in FIGS. 6B and 7B. Then, as shown in FIG. 7C, the second through electrode 43 is formed in each first through hole 42 by electrolytic plating, for example.

Next, the process of manufacturing the wiring substrate 20 will be described.

Figure 8A:
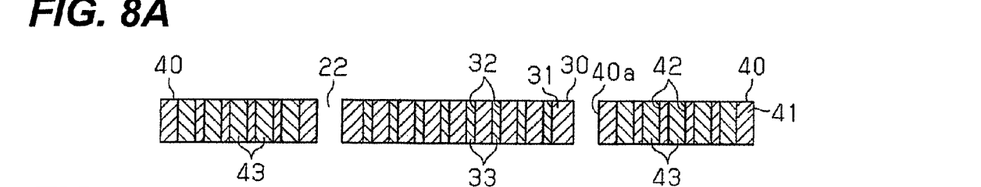
FIGS. 8A-8E are schematic cross-sectional views showing the process of manufacturing the wiring substrate.

First, as shown in FIG. 8A, the first core substrate 30 is placed in the housing hole 40a of the second core substrate 40.

Figure 8B:
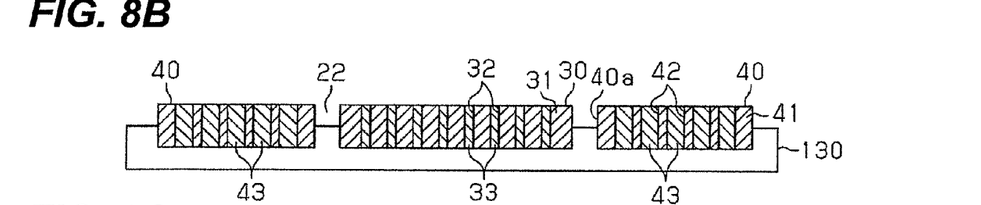

Then, as shown in FIG. 8B, the first and second core substrates 30 and 40 are arranged on the upper surface of a sheet-like resin film 130 having a larger outer shape than the second core substrate 40, for example, so as to be separated from each other in a planar direction. The material of the resin film 130 is an epoxy resin, for example. In addition, resin is filled into the gap 22 by pressing the first and second core substrates 30 and 40 against the resin film 130 using the resin film 130 in a B-stage state (semi-cured state), for example. In addition, it is also possible to bond and fix the first and second core substrates 30 and 40 to the resin film 130 and fill the gap 22 with resin.

Figure 8C:
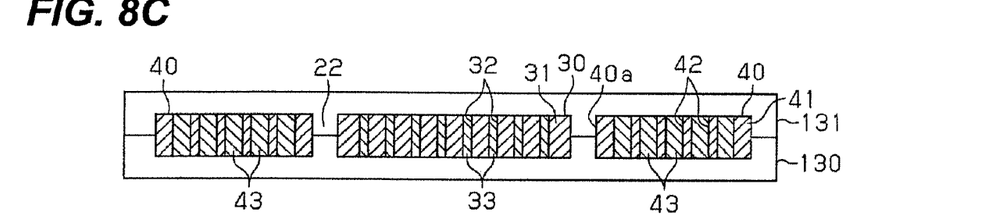

Then, as shown in FIG. 8C, a resin film 131 is provided on the first and second core substrates 30 and 40 so as to be located on the opposite side to the resin film 130. As a result, the first and second core substrates 30 and 40 are sandwiched between the resin films 130 and 131 such that the resin films 130 and 131 encapsulate the first and second core substrates 30 and 40. The resin film 131 may be formed of the same material as the resin film 130. The resin film 131 is formed in the same outer shape as the resin film 130. Then, the resin films 130 and 131 are cured by performing heat treatment while pressing the resin films 130 and 131 in a vertical direction, for example, thereby resulting in a single-piece construction. As such, an insulating layer 51 is formed on a first surface of the first and second core substrates, and an insulating layer 71 is formed on a second surface of the first and second core substrates. The resin films 130 and 131 are filled into the gap 22 between the first and second core substrates 30 and 40. As a result, the first insulating member 23 is formed. In addition, an outer peripheral edge of the second core substrate 40 is covered by the second insulating member 24, which is constituted by the resin films 130 and 131. In addition, it is possible to prevent gas from remaining between the resin films 130 and 131 of the gap 22 by pressing the resin films 130 and 131 in a vacuum atmosphere.

Figure 8D:
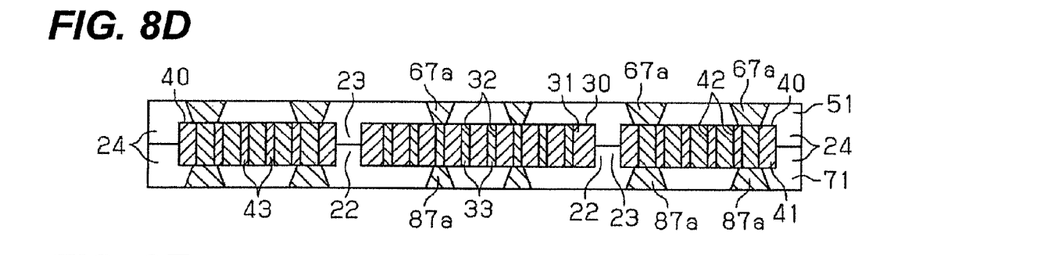

Then, as shown in FIG. 8D, each via 67a is formed at a predetermined position of the insulating layer 51 using a laser, for example, so that the upper ends of the first and second through electrodes 33 and 43 are exposed. Similarly, the via 87a is formed in the insulating layer 71.

Figure 8E:
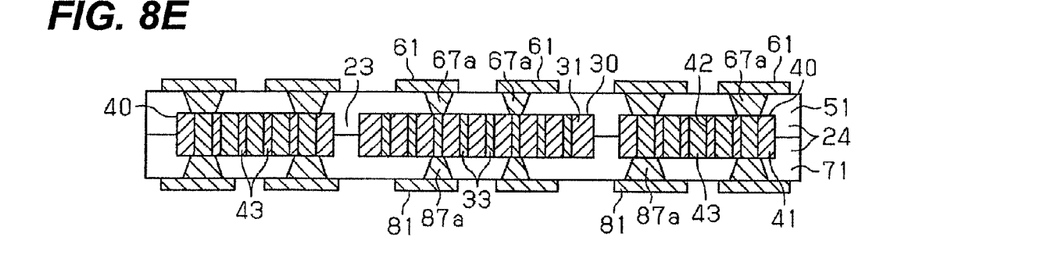

Then, as shown in FIG. 8E, the wiring layer 61 is formed on the upper surface of the insulating layer 51. The wiring layer 61 and the via 67a may be formed in the same process using a semi-additive method, for example. Similarly, the wiring layer 81 is formed on the lower surface of the insulating layer 71.

Figure 9A:
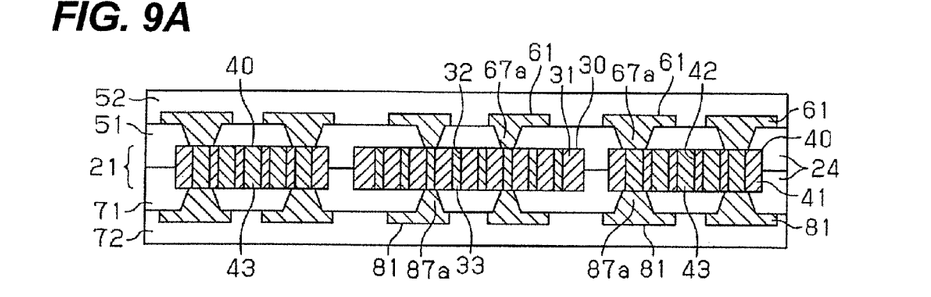
FIGS. 9A-9C are schematic cross-sectional views showing the process of manufacturing the wiring substrate.

Then, as shown in FIG. 9A, the insulating layer 52 is formed so as to cover the surfaces of the upper insulating layer 51 and the upper wiring layer 61. In addition, the insulating layer 72 is formed so as to cover the surfaces of the lower insulating layer 71 and the lower wiring layer 81.

Figure 9B:
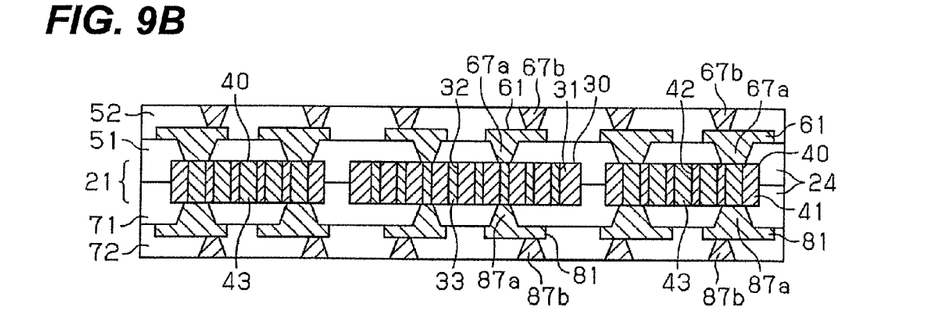
Figure 9C:
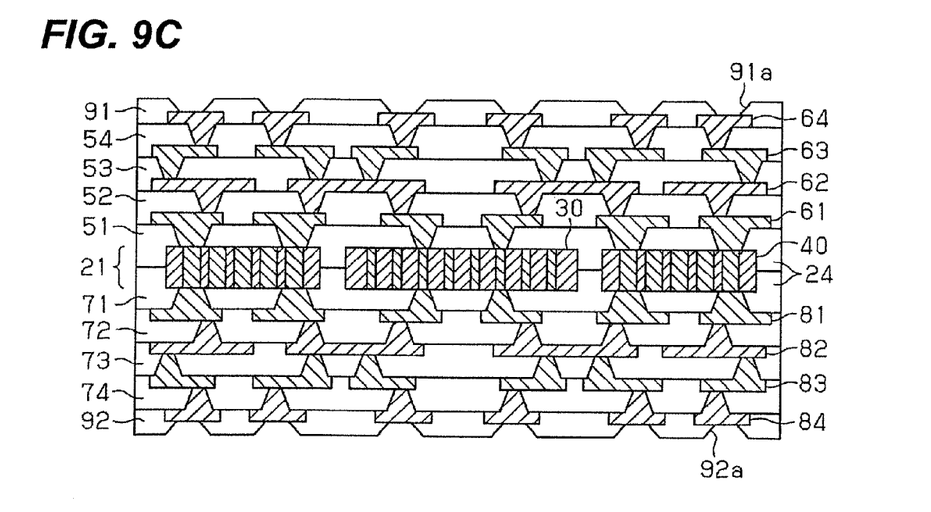

Then, as shown in FIG. 9B, the via 67b connected to the wiring layer 61 is formed in the insulating layer 52. In addition, the via 87b connected to the wiring layer 81 is formed in the insulating layer 72. Insulating layers and wiring layers are alternately formed in this manner. As a result, shown in FIG. 9C, the wiring layers 61 to 64 and the insulating layers 51 to 54 are formed above the core substrate 21, and the wiring layers 81 to 84 and the insulating layers 71 to 74 are formed below the core substrate 21. In addition, FIG. 9C shows a case where there are four insulating layers and four wiring layers. Then, the surfaces of the upper wiring layer 64 and the lower wiring layer 84 are covered by the protective layers 91 and 92 and the openings 91a and 92a corresponding to the wiring layers 64 and 84 are formed in the protective layers 91 and 92, respectively. As a result, the wiring substrate 20 is manufactured.

As described above, according to the present embodiment, the following effects are obtained.

(1) The core substrate 21 of the wiring substrate 20 has the first and second core substrates 30 and 40 and the first and second insulating members 23 and 24. In the first glass substrate 31 of the first core substrate 30, the first through electrode 33 is formed in the first through hole 32 formed in a predetermined hole diameter (first diameter). In addition, in the second glass substrate 41 of the second core substrate 40, the second through electrode 43 is formed in the second through hole 42 formed in a larger hole diameter (second diameter) than the first through hole 32. The first and second core substrates 30 and 40 are arranged to be separated from each other in the planar direction of the first core substrate 30 with the first insulating member 23 interposed therebetween. The wiring layer 61 located above the core substrate 21 is electrically connected to the first and second through electrodes 33 and 43 through the via 67a. The wiring layers 61 to 65 are connected to each other through the vias 67b to 67e. In addition, the wiring layer 65 is exposed as the electrode 65a, which is connected to an electronic component such as a semiconductor chip, through the opening 91a of the protective layer 91 that covers the insulating layer 55 and the wiring layer 65.

In such a configuration, a narrow-pitch (multi-pin) device such as a semiconductor chip can be connected to the electrode 65a, for example, by forming the first through electrodes 33 having small diameters at narrow pitches therebetween in order to increase the wiring density of the wiring layers 61 to 65 connected to the first through electrodes 33. In addition, the wiring layers 61 to 65 connected to the second through electrodes 43 having large diameters can be formed with a desired wiring density according to other electronic components (having relatively large pitches) and the like. That is, the wiring substrate 20 that can be more reliably connected to mounting components can be configured by forming the first and second through electrodes 33 and 43, which have different diameters according to mounting components, in the core substrate 21.

(2) The gap 22 between the first and second core substrates 30 and 40 is filled with the first insulating member 23. In addition, the outer peripheral edge of the second core substrate 40 (second glass substrate 41) is covered by the second insulating member 24. In such a configuration, since the insulating layer 51 formed on the upper surface of the core substrate 21 and the insulating layer 71 formed on the lower surface of the core substrate 21 are connected to each other by the first and second insulating members 23 and 24, adhesion of the insulating layers 51 and 71 to the glass substrates 31 and 41 is improved. Accordingly, internal stress caused in the glass substrates 31 and 41 when manufacturing the wiring substrate 20 can be reduced. As a result, it is possible to prevent cracking of the glass substrates 31 and 41 and the like.

(3) The first through electrodes 33 (first through holes 32) are formed at predetermined pitches (first pitches) in the first glass substrate 31. In addition, the second through electrodes 43 (second through holes 42) are formed in the second glass substrate 41 at larger pitches (second pitches) than the pitch between the first through holes 32. In such a configuration, the wiring substrate 20 that can be more reliably connected to mounting components can be configured by forming the first and second through electrodes 33 and 43, which have different pitches according to mounting components or the like, in the core substrate 21.

(4) The housing hole 40a according to the shape of the first core substrate 30 is formed in the second core substrate 40, and the first core substrate 30 is housed in the housing hole 40a. In such a configuration, since the first core substrate 30 can be disposed according to the position of the housing hole 40a of the second core substrate 40, it is easy to adjust the positioning of the first core substrate 30.

(5) In the process of manufacturing the wiring substrate 20, the first core substrate 30 is disposed in the housing hole 40a of the second core substrate 40, and the first and second core substrates 30 and 40 are arranged on the upper surface of the resin film 130 (first insulating sheet), which has a larger outer shape than the second core substrate 40, so as to be separated from each other in the planar direction of the first core substrate 30. Then, the resin film 131 having the same outer shape as the resin film 130 is provided on the surfaces of the first and second core substrate 30 and 40 not facing the resin film 130. By making the first and second core substrates 30 and 40 interposed between the resin films 130 and 131, the insulating layers 51 and 71 are formed. The resin films 130 and 131 are filled into the gap 22 between the first and second core substrates 30 and 40. As a result, the first insulating member 23 is formed. In addition, the outer peripheral edge of the second core substrate 40 is covered by the second insulating member 24. The core substrate 21 can be formed by locating each of the first and second core substrates 30 and 40, which have been formed in this manner, at a desired position. In addition, it is possible to easily form the first insulating member 23, which is formed in the gap 22 between the first and second core substrates 30 and 40, and the second insulating member 24, which covers the outer peripheral edge of the second core substrate 40.

(6) In the process of manufacturing the wiring substrate 20, the first through hole 32 is formed by exposing the photosensitive glass plate 100 through the photomask 110, performing heat treatment on the exposed portion 101, and etching the exposed portion 101. In this manner, the first through holes 32 can be formed in smaller hole diameters and at narrower pitches therebetween.

Figure 10:
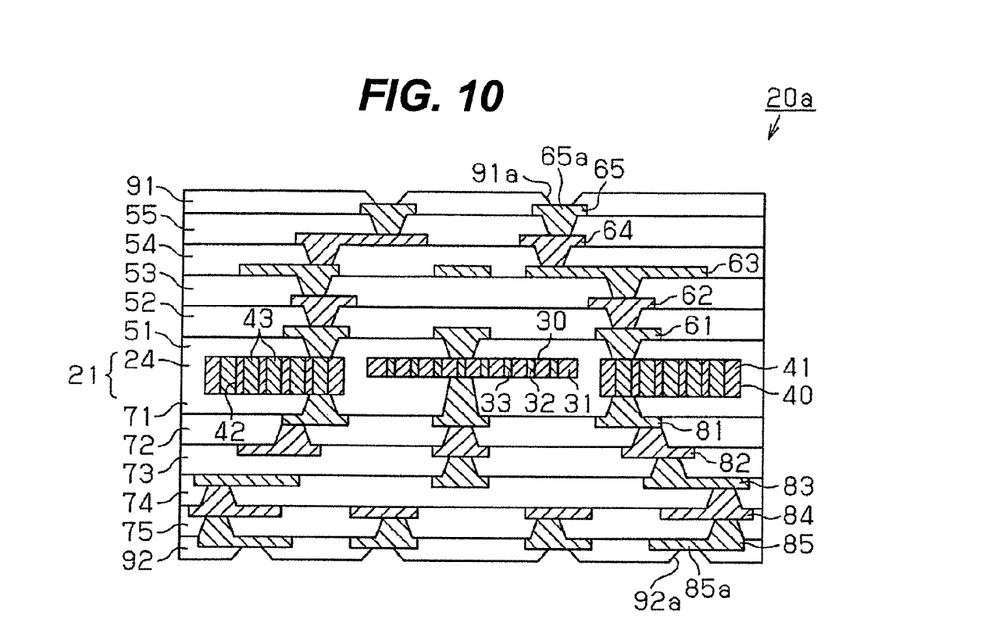
FIG. 10 is a schematic cross-sectional view of another wiring substrate.

In addition, the above-described embodiment may also be changed as follows. In the above-described embodiment, the first and second glass substrates 31 and 41 are formed in the same thickness. However, for example, as shown in FIG. 10, a wiring substrate 20a may be configured such that the thickness of the first glass substrate 31, in which the diameter of the through hole (through hole electrode) is small, is thinner than the thickness of the second glass substrate 41, in which the diameter of the through hole (through hole electrode) is large. In other words, in the wiring substrate 20a, the thickness of the second glass substrate 41, in which the diameter of the through hole electrode is large, is thicker than the thickness of the first glass substrate 31, in which the diameter of the through hole (through hole electrode) is small. In the process of forming the first and second through holes 32 and 42 in the glass plates 120 and 121 (refer to FIGS. 5A-5C and 7A-7C), the thicknesses of the first and second glass substrates 31 and 41 are determined based on the hole diameters of the through holes 32 and 42, respectively. Specifically, for example, when it is necessary to further reduce the hole diameter of the first through hole 32, that is, when it is necessary to further reduce the diameter of the through electrode 33 and the pitch between the through electrodes 33, there is a method of reducing the thickness of the first glass substrate 31 in order to prevent the etching of a desired hole diameter or more. Therefore, the first through electrode 33 can be easily formed by reducing the thickness of the first glass substrate 31 in which the first through electrode 33 with a smaller diameter is formed.

Figure 11:
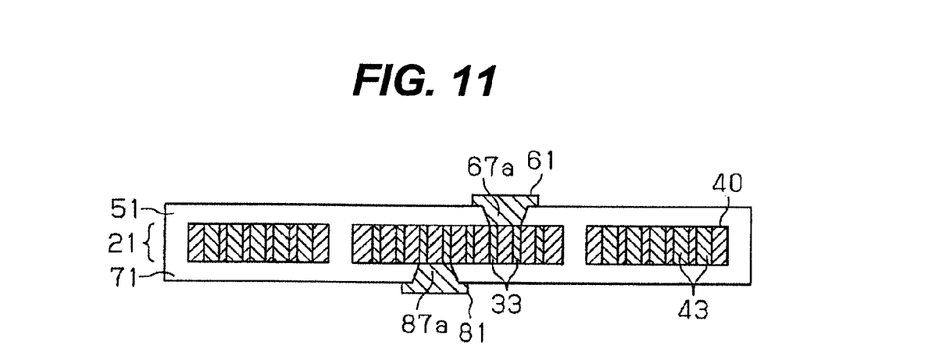
FIG. 11 is a schematic cross-sectional view showing a part of the another wiring substrate.

In the above-described embodiment, it is also possible to adopt a configuration in which a plurality of first through electrodes 33 and a plurality of second through electrodes 43 are connected to each of the vias 67a and 87a connected to the wiring layers 61 and 81. For example, as shown in FIG. 11, in the case of the via 67a connected to the wiring layer 61, a plurality of (in the drawing, two) first through electrodes 33 are connected to one via 67a. In such a configuration, the vias 67a and 87a and the first and second through electrodes 33 and 43 may be connected to each other according to the wiring density of the wiring layers 61 to 65 and 81 to 85.

Figure 12:
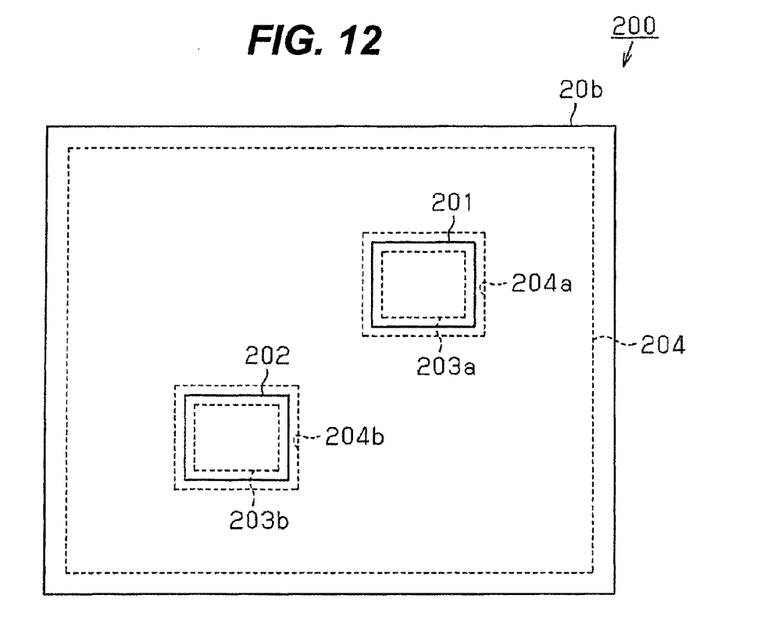
FIG. 12 is a schematic diagram of a semiconductor device using the another wiring substrate.

In the above-described embodiment, it is also possible to adopt a configuration in which a plurality of first core substrates 30 (first glass substrates 31) and a plurality of second core substrates 40 (second glass substrates 41) are provided. For example, in a semiconductor device 200 shown in FIG. 12, two semiconductor chips 201 and 202 are mounted on a wiring substrate 20b. The wiring substrate 20b has two first core substrates 203a and 203b connected to the semiconductor chips 201 and 202, respectively, and a one second core substrate 204. Rectangular housing holes 204a and 204b in which the first core substrates 203a and 203b are housed, respectively, are formed in the second core substrate 204.

Figure 13:
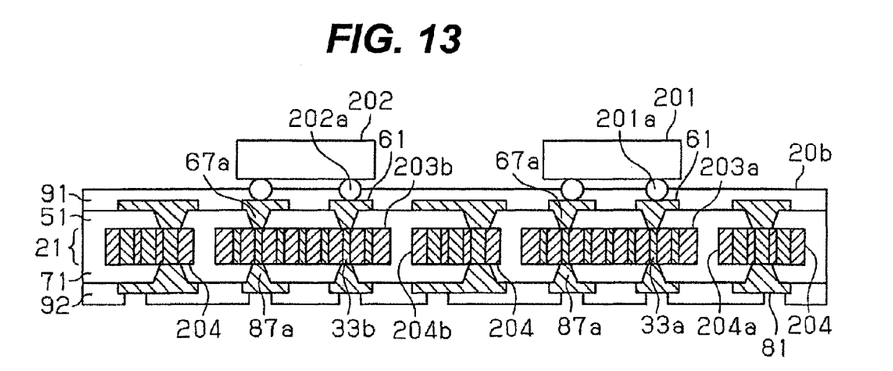
FIG. 13 is a cross-sectional view of the semiconductor device shown in FIG. 12.

As shown in FIG. 13, an electrode pad 201a of the semiconductor chip 201 is electrically connected to a first through electrode 33a of the first core substrate 203a through the wiring layer 61. In addition, an electrode pad 202a of the semiconductor chip 202 is electrically connected to a first through electrode 33b of the first core substrate 203b through the wiring layer 61. The diameters and pitches of the first through electrodes 33a and 33b are different. In such a configuration, a wiring substrate can be configured in which the through electrodes 33a and 33b having different diameters and pitches according to the plurality of semiconductor chips 201 and 202 are formed.

Figure 14:
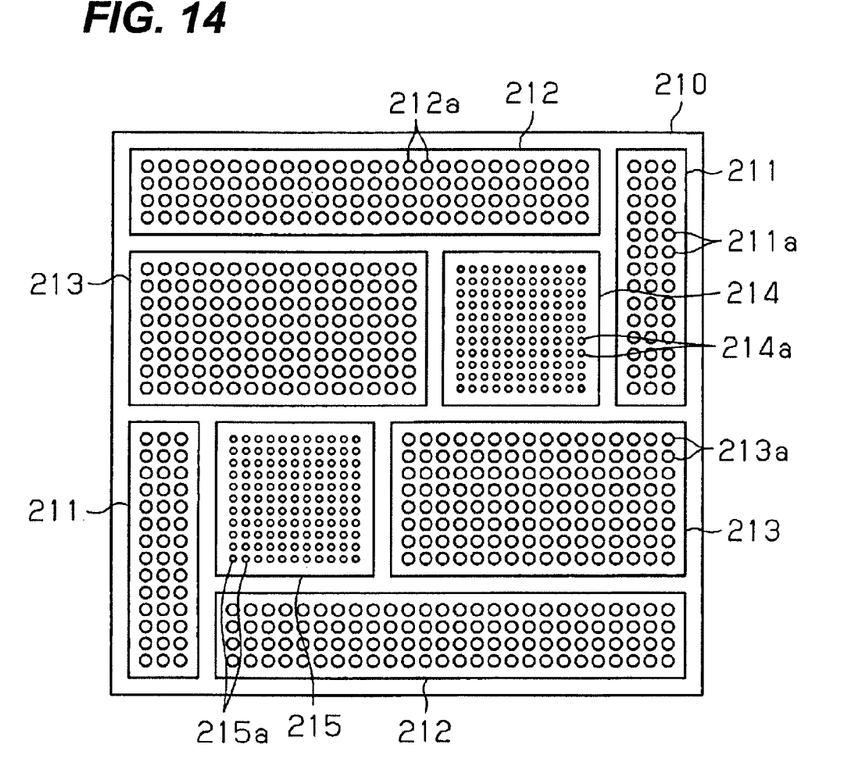
FIG. 14 is a schematic diagram of another core substrate.

In addition, the core substrate 21 may be configured using a plurality of first core substrates 30 and a plurality of second core substrates 40. For example, a core substrate 210 shown in FIG. 14 has a set of second core substrate 211, 212, and 213 having different shapes. The diameters and pitches of second through electrodes 211a, 212a, and 213a of the second core substrate 211, 212, and 213 are different. In addition, first core substrates 214 and 215 are provided on the same plane so as to be surrounded by the second core substrate 211, 212, and 213 and such that the diameters and pitches of first through electrodes 214a and 215a are different. Also in such a configuration, it is possible to configure a wiring substrate in which the through electrodes 211a, 212a, 213a, 214a, and 215a having different diameters and pitches according to a plurality of electronic components are formed.

In the above-described embodiment, it is also possible to adopt a configuration in which either the diameters of the first and second through electrodes 33 and 43 or the pitches of the first and second through electrodes 33 and 43 are different.

The pitch (first pitch) between the first through holes 32 may be set to be larger than the pitch (second pitch) between the second through holes 42. In addition, the hole diameter of the first through hole 32 may be set to be larger than the hole diameter of the second through hole 42.

The material of the first and second glass substrates 31 and 41 (glass 120 and 121) is not limited to photosensitive glass, and soda lime glass, alkali-free glass, and the like may also be used. The material of the insulating layers 51 to 55 and 71 to 75 (resin films 130 and 131) is not limited to epoxy-based resin, and polyimide-based resin may also be used. In addition, it is also possible to use photosensitive resin without being limited to the thermosetting resin.

The material of the wiring layers 61 to 65 and 81 to 85 is not limited to copper, and other metals such as gold or alloys may also be used. The first and second through electrodes 33 and 43 may be formed using electroless plating. In addition, the first and second through electrodes 33 and 43 may also be formed using both electroless plating and electrolytic plating.

The wiring layers 61 to 65 and 81 to 85 may be formed using various kinds of wiring forming methods, such as a subtractive method. Exposure of the first and second through holes 32 and 42 may be performed by direct exposure in which no photomask is used.

The core substrate 21 may be configured such that the second insulating member 24 that covers the outer peripheral edge of the second glass substrate 41 is not provided.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A wiring substrate comprising:
a core substrate comprising:
a first core substrate having a first surface, a second surface being opposite to the first surface, and a side surface connecting the first surface and the second surface, comprising:
a plate-shaped first glass substrate; and
a first through electrode formed through the first and second surfaces of the first core substrate, the first through electrode comprising
a first surface being exposed from the first surface of the first core substrate,
a second surface being exposed from the second surface of the first core substrate, and
a side surface connecting the first and second surfaces of the first through electrode, and
a second core substrate having a first surface, a second surface being opposite to the first surface, and a side surface connecting the first surface and the second surface, comprising:
a plate-shaped second glass substrate; and
a second through electrode formed through the first and second surfaces of the second core substrate, the second through electrode comprising
a first surface being exposed from the first surface of the second core substrate,
a second surface being exposed from the second surface of the second core substrate, and
a side surface connecting the first and second surfaces of the second through electrode,
wherein a diameter of the second through electrode is different from that of the first through electrode, and
an insulating member covers the first, second, and side surfaces of the first core substrate and the first, second, and side surfaces of the second core substrate, and
a wiring layer formed on the first and second surfaces of the first and second core substrates,
wherein when viewed from above the first surfaces of the first and second core substrates, the first and second core substrates are arranged to be separated from each other so that the side surfaces of the first and second core substrates face each other.

2. The wiring substrate of claim 1, wherein the core substrate has a first surface and a second surface opposite to the first surface, and
wherein the core substrate further comprises:
a first via formed in the insulating member to be exposed from the first surface of the core substrate and to be electrically connected to the first through electrode of the first core substrate;
a second via formed in the insulating member to be exposed from the second surface of the core substrate and to be electrically connected to the first through electrode of the first core substrate;
a third via formed in the insulating member to be exposed from the first surface of the core substrate and to be electrically connected to the second through electrode of the second core substrate; and
a fourth via formed in the insulating member to be exposed from the second surface of the core substrate and to be electrically connected to the second through electrode of the second core substrate.

3. The wiring substrate of claim 1, wherein
the diameter of the second through electrode is a larger diameter than that of the first through electrode, and
a thickness of the second core substrate is thicker than that of the first core substrate.

4. The wiring substrate of claim 1,
wherein the first through electrode comprises a plurality of first through electrodes, and the second through electrode comprises a plurality of second through electrodes, and
wherein a distance between adjacent second through electrodes is larger than a distance between adjacent first through electrodes.

5. The wiring substrate of claim 1, wherein the second core substrate is arranged to surround the first core substrate.

6. The wiring substrate of claim 4,
wherein the wiring layer is electrically connected to two or more first through electrodes among the plurality of first through electrodes through one via.

* * * * *